(12) United States Patent
Baeckler et al.

(10) Patent No.: US 7,350,176 B1
(45) Date of Patent: Mar. 25, 2008

(54) TECHNIQUES FOR MAPPING TO A SHARED LOOKUP TABLE MASK

(75) Inventors: Gregg Baeckler, San Jose, CA (US); Michael Hutton, Mountain View, CA (US)

(73) Assignee: Altera Corporation, San Jose, CA (US)

(*) Notice: Subject to any disclaimer, the term of this patent is extended or adjusted under 35 U.S.C. 154(b) by 467 days.

(21) Appl. No.: 10/622,923

(22) Filed: Jul. 17, 2003

(51) Int. Cl.
*G06F 17/50* (2006.01)

(52) U.S. Cl. .............................. 716/16; 716/17; 716/2; 716/4; 716/19

(58) Field of Classification Search ............ 716/16–17, 716/2, 4, 19
See application file for complete search history.

(56) References Cited

U.S. PATENT DOCUMENTS

| | | | | |
|---|---|---|---|---|
| 5,387,985 A * | 2/1995 | Loce et al. | ................. | 358/447 |
| 5,452,227 A * | 9/1995 | Kelsey et al. | ................... | 716/3 |
| 5,636,368 A * | 6/1997 | Harrison et al. | .............. | 716/16 |
| 6,360,352 B2 * | 3/2002 | Wallace | .......................... | 716/2 |
| 6,380,759 B1 * | 4/2002 | Agrawal et al. | .............. | 326/41 |
| 6,473,885 B1 * | 10/2002 | Wallace | .......................... | 716/4 |
| 6,490,717 B1 * | 12/2002 | Pedersen et al. | .............. | 716/18 |
| 6,529,284 B1 * | 3/2003 | Ganapathy et al. | ......... | 358/1.11 |
| 6,798,240 B1 * | 9/2004 | Pedersen | ....................... | 326/39 |
| 6,848,094 B2 * | 1/2005 | Andreev et al. | .............. | 716/12 |
| 6,957,412 B1 * | 10/2005 | Betz et al. | ..................... | 716/16 |
| 7,020,855 B2 * | 3/2006 | Wallace | ........................ | 716/2 |
| 7,075,827 B2 * | 7/2006 | Aoyama et al. | ....... | 365/185.24 |
| 7,167,022 B1 * | 1/2007 | Schleicher et al. | ........... | 326/41 |
| 2003/0229658 A1 * | 12/2003 | Guidry | ....................... | 708/272 |
| 2004/0193835 A1 * | 9/2004 | Devaney et al. | ........... | 711/220 |
| 2005/0024086 A1 * | 2/2005 | Or-Bach | ....................... | 326/41 |
| 2005/0280438 A1 * | 12/2005 | Park | ........................... | 326/41 |
| 2006/0097750 A1 * | 5/2006 | Leijten-Nowak | ............ | 326/39 |
| 2006/0117280 A1 * | 6/2006 | Wallace | .......................... | 716/4 |
| 2006/0176075 A1 * | 8/2006 | Or-Bach | ....................... | 326/38 |
| 2006/0256213 A1 * | 11/2006 | Sasaki | ................... | 348/231.99 |

\* cited by examiner

*Primary Examiner*—Paul Dinh
*Assistant Examiner*—Suchin Parihar
(74) *Attorney, Agent, or Firm*—Townsend and Townsend and Crew LLP

(57) ABSTRACT

Techniques for combining lookup tables on a programmable integrated circuit are provided. Lookup tables (LUTS) in a design for a programmable circuit can be combined into one mask if they implement the same function. Any two LUTs in a design can be compared to determine if they implement the same function by rearranging the input signals of one of the LUTs with respect to the input terminals of that LUT. Pairs of LUTs can be rejected if they do not share at least N common input signals, or if they have more than M unique input signals.

19 Claims, 4 Drawing Sheets

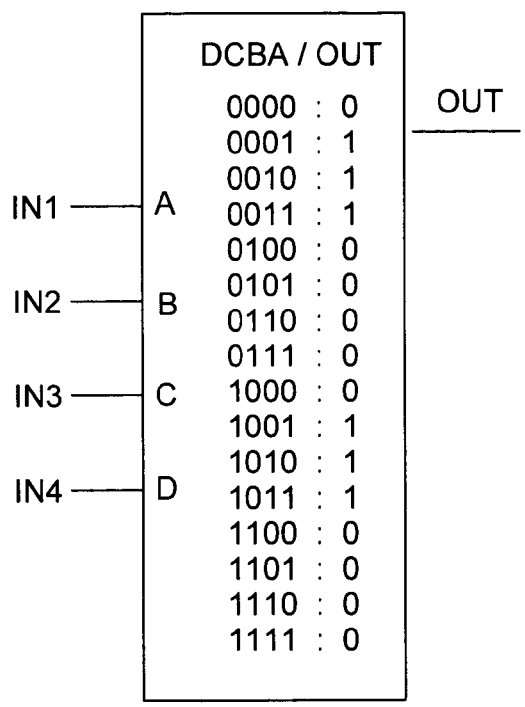
FIG. 2A
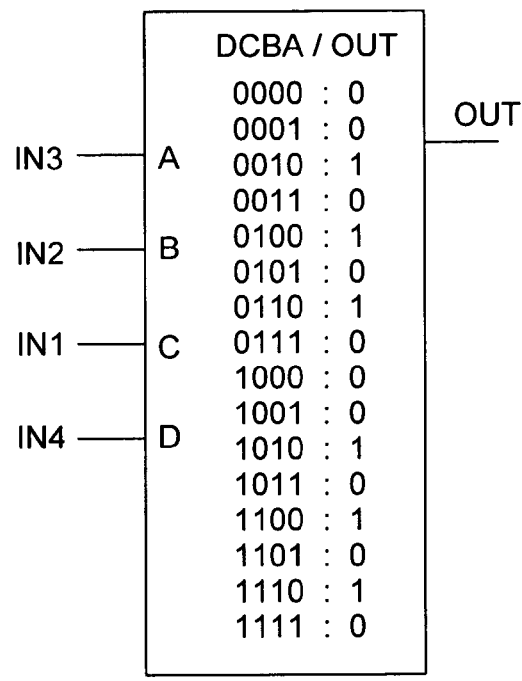
FIG. 2B
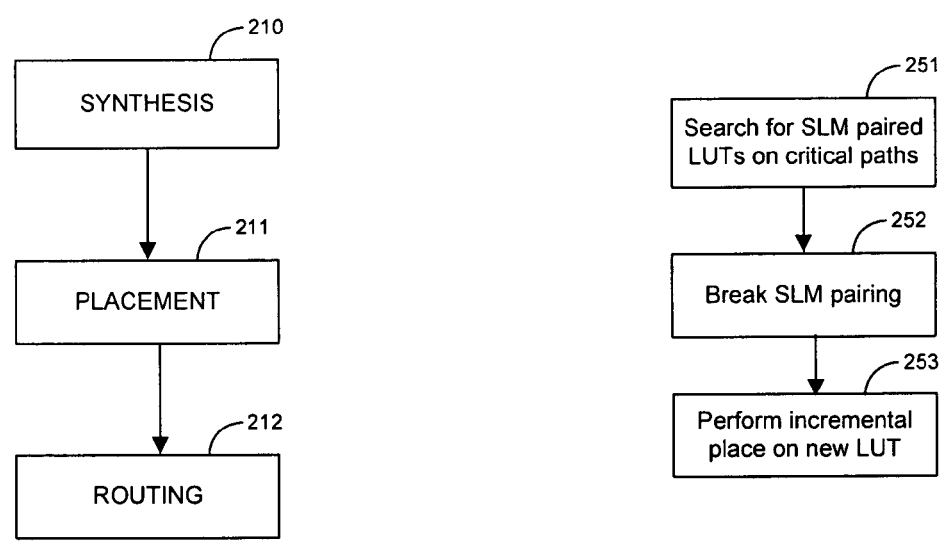
FIG. 2C
FIG. 2D

TECHNIQUES FOR MAPPING TO A SHARED LOOKUP TABLE MASK

BACKGROUND OF THE INVENTION

The present invention relates to techniques for reducing the number of look up tables used by a design for a programmable integrated circuit, and more particularly, to techniques for combining two lookup tables into a shared mask.

Programmable logic devices are programmable integrated circuits that can be programmed to implement many types of circuit designs. Other types of programmable integrated circuits include field programmable gate arrays (FPGAs), programmable logic arrays (PLAs), and configurable logic arrays (CLAs).

Programmable integrated circuits include numerous programmable circuit elements that are programmed to perform individual functions within a circuit design. Logic elements are examples of the programmable circuit elements. Logic elements typically include lookup tables. A lookup table (LUT) is a small binary memory circuit.

A LUT receives a set of N digital input signals. The input signals are treated as a binary value with N bits. The binary value of the input signals are used as a memory address to access one of the LUT memory locations. A LUT outputs bits stored in the memory location. The memory location has an address corresponding to the binary value of the input signals.

A LUT implements a function. A LUT stores an output value corresponding to each set of input values. The pattern of output values describes the function. For example, if a 4-input LUT implements an AND function, the LUT stores the two possible binary output values 0 and 1. The LUT outputs 0, except when all 4 input signal are 1.

Programmable integrated circuits typically use numerous LUTs to implement functions of a circuit design. Frequently, subsets of the LUTs implement the same functions using some of the same signals. In general, it is highly desirable to implement a circuit design using as few programmable circuit elements as possible to save resources on the integrated circuit.

Therefore, it would be desirable to provides techniques for combining lookup tables on a programmable circuit that implement the same function.

BRIEF SUMMARY OF THE INVENTION

The present invention provides systems and methods for combining lookup tables on a programmable circuit. Lookup tables in a circuit design for a programmable integrated circuit can be combined into one shared LUT mask (SLM) if they implement the same function.

According to the present invention, any two or more LUTs in a circuit design can be analyzed to determine if they implement the same function. First, the input signals of one of the LUTs can be rearranged into different orders with respect to the input terminals of that LUT. Each order or permutation of the input signals is tested by applying every possible input value to the input terminals of each LUT. The output values generated by the first LUT are then compared to the output values generated by the second LUT. If both LUTs generate the same output value for each possible input value, the LUTs perform the same function.

According to another embodiment, the common input signals are rearranged into the same order in each LUT. The output values of the LUTs are then compared to determine if the LUTs perform the same function. If the LUTs do not appear to perform the same function with the selected order of input signals, the uncommon input signals of one of the LUTs are rearranged. The output values of the LUTs are compared again to determine if the LUTs perform the same function. If two LUTs perform the same function, they are combined into a shared LUT mask. Other permutations of the uncommon input signals can also be tested.

According to further embodiments of the present invention, only LUTs that share at least N common input signals are combined into one shared LUT mask. This requirement ensures that only LUT combinations that achieve an area savings on the programmable integrated circuit are combined into one shared LUT mask.

According to another embodiment, only LUTs that have no more than M unique input signals can be combined into one shared LUT mask. This requirement ensures that a shared LUT mask does not have too many input signals.

Other objects, features, and advantages of the present invention will become apparent upon consideration of the following detailed description and the accompanying drawings, in which like reference designations represent like features throughout the figures.

BRIEF DESCRIPTION OF THE DRAWINGS

FIGS. 2A-2B are diagrams that illustrate how different permutations of lookup table input signals effect the output signals according embodiments of the present invention;

FIG. 2C is a flow chart that illustrates a general process for converting a circuit design for a programmable circuit into a configuration pattern that can be programmed directly onto the programmable circuit;

FIG. 2D is a flow chart that illustrates a process for breaking up LUTs that have been combined according to the techniques of the present invention;

DETAILED DESCRIPTION OF THE INVENTION

As discussed above, a lookup table is a memory circuit that can perform a function used by a design for a programmable integrated circuit (IC). According to embodiments of the present invention, two look up tables (LUTs) in a design for a programmable integrated circuit can be combined into one shared LUT mask (SLM) to increase logic efficiency and to save area on the programmable IC. Programmable ICs include programmable logic devices (PLDs), field programmable gate arrays (FPGAs), configurable logic arrays, programmable logic arrays, configurable gate arrays, etc.

Two LUTs can be combined if both LUTs implement the same function. Typically, two LUTs are only combined if they both receive at least N common input signals and have no more than M unique input signals. If these requirements (and any other requirements) are satisfied, the LUTs can be combined into shared LUT mask that is programmed onto a programmable IC.

Figure 1:
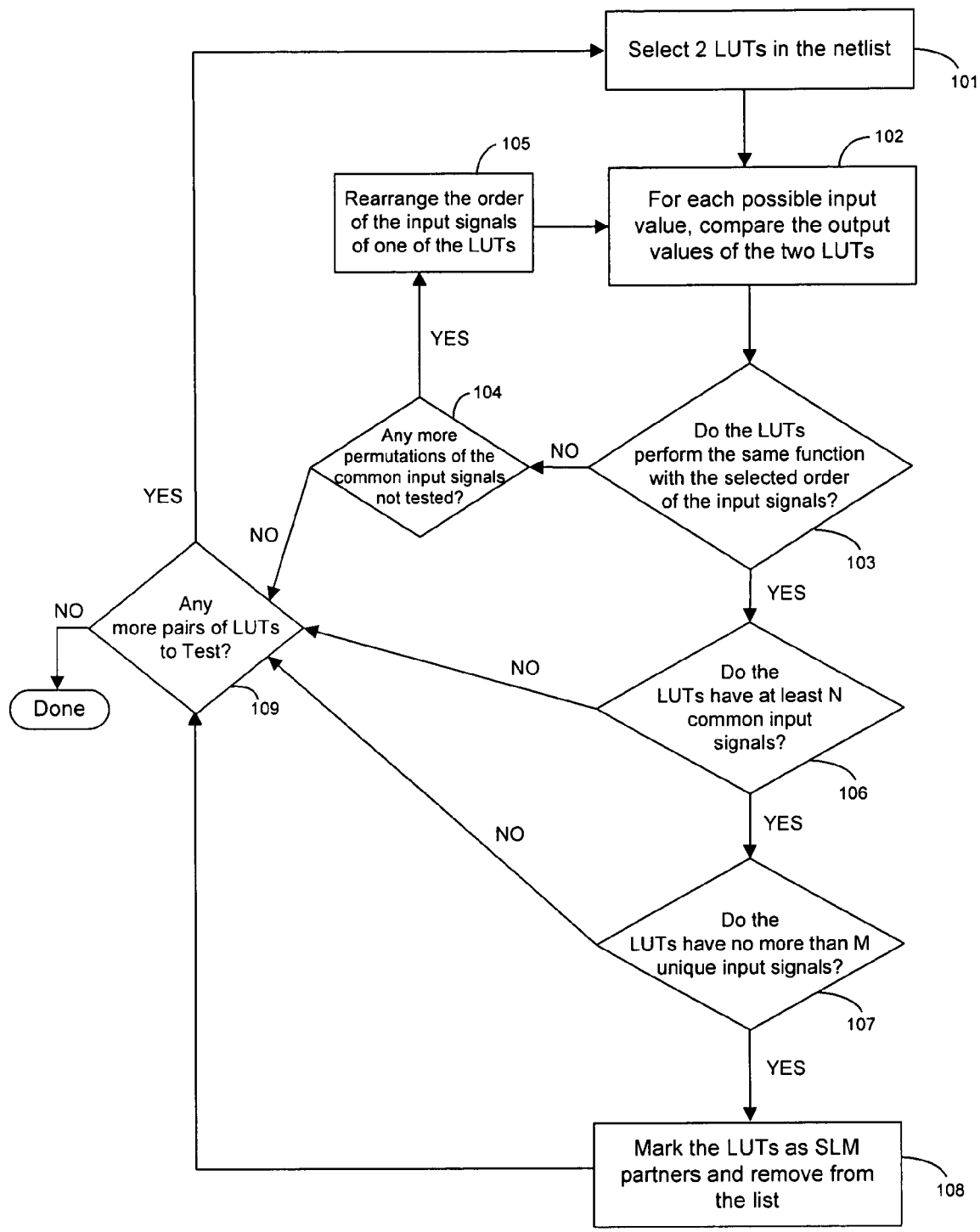
FIG. 1 is a flow chart that illustrates a process for combining lookup tables on a programmable circuit according to a first embodiment of the present invention.

FIG. 1 is a flow chart that illustrates a process for combining lookup tables on a programmable IC according to a first embodiment of the present invention. During synthesis, a circuit design for a programmable integrated circuit (IC) is converted into a plurality of lookup tables (LUTs) and other circuit elements so that the circuit design can be programmed directly onto the programmable IC. The configuration of lookup tables and other circuit elements that implement a circuit design for a programmable IC is called a netlist. In step 101, a process of the present invention analyzes the netlist and selects a pair of two lookup tables (LUTs).

In step 102, the process compares the output values of the LUTs for each possible input value. For a given input value provided to inputs of both LUTs, the output values of the LUTs are compared to determine of they are the same. For example, a binary input value of 000001 is applied to two six input LUTs. The process then determines if the output values of both LUTs are the same for this binary input value and every other possible binary input value. For a six input LUT, there are $2^6$ or 64 possible binary input values.

At decisional step 103, the process determines if the two selected LUTs perform the same function. Two LUTs perform the same function if both LUTs generate the same output value for every possible input value. For example, two six input LUTs implement the same function if they both generate the same output value for all 64 possible binary input values.

If the LUTs do not generate the same output values for every possible input value, the process implements steps 104 and 105. In step 104, the process determines if there any more permutations of the input signals that have not been tested yet. If there are more untested permutations of the input signals, the process proceeds to step 105.

In step 105, the order of the input signals of one of the LUTs is rearranged with respect to the input terminals of that LUT. FIGS. 2A-2B illustrate how the order of the input signals of a LUT can be rearranged, and how rearranging the order of the input signals effects the output values.

The example LUT shown in FIGS. 2A-2B includes four input terminals A, B, C, and D. The four input terminals receive input signals IN1, IN2, IN3, and IN4. The LUT generates binary output values at OUT for each of the 16 binary input values received at input terminals DCBA. The binary output values of output signal OUT that correspond to each of the 16 possible binary input values of IN1-IN4 are shown inside the LUTs of FIGS. 2A-2B.

Before the input signals are rearranged, the LUT receives input signals IN1, IN2, IN3, and IN4 at terminals ABCD, respectively, as shown in FIG. 2A. This order of the input signals generates the output signal values at OUT as shown inside the LUT of FIG. 2A. At step 105, the order of the input signals is rearranged with respect input terminals ABCD of the LUT as shown, for example, in FIG. 2B. Specifically, input signals IN1 and IN3 are swapped between input terminals A and C. Input signal IN2 remains at terminal B, and input signal IN4 remains at terminal D.

When the input signals are rearranged in step 105, the binary values stored in memory are permuted to maintain the LUT's behavior. The permutation pattern depends on the permutation of the input signals. Rearranging the permutation of LUT input signals is referred to as LUT rotation. The contents of the LUT in FIG. 2B are shown in a different order to illustrate the effect of rearranging the input signals.

After IN1 and IN3 have been swapped between terminals A and C, the binary values of input signals IN1-IN4 now correspond to different output values at OUT. For example, the input signals IN1-IN4 can equal 0011, respectively. Input terminals DCBA in the LUT of FIG. 2A receive the input value 1100 when input signals IN1-IN4 correspond to a binary value of 0011. Input terminals DCBA in the LUT of FIG. 2B receive the input value 1001 when input signals IN1-IN4 correspond to a binary value of 0011. When input terminals DCBA in FIG. 2A receive 1100, respectively, OUT is 0. When input terminals DCBA in FIG. 2B receive 1001, respectively, OUT is also 0.

As another example, when IN1-IN4 equal 1110, respectively, DCBA of the LUT in FIG. 2A receives 0111, and OUT equals 0 (8th entry in LUT). When IN1-IN4 equal 1110, respectively, DCBA of the LUT in FIG. 2B receives 0111, and OUT also equals 0 (8th entry in LUT).

As another example, when IN1-IN4 equal 1100, respectively, DCBA of the LUT in FIG. 2A receives 0011, and OUT equals 1 (4th entry in LUT). When IN1-IN4 equal 1100, respectively, DCBA of the LUT in FIG. 2B receives 0110, and OUT also equals 1 (7th entry in LUT).

After the input signals of one of the two LUTs has been rearranged in step 105, the output values of the first LUT are again compared to the output values of the second LUT in step 102 for each possible binary input value. Steps 102-105 are repeated for each possible permutation (order) of the input signals with respect to input terminals of one of the LUTs. For example, for a four input LUT, there are 16 possible permutations that the input signals can be coupled to the LUT input terminals.

If one of the permutations of the input signals tested in an iteration of steps 102-105 leads to common output signal values for both LUTs, the process determines that the two selected LUTs perform an identical function. The process then marks that input signal permutation and proceeds to step 106.

If none of the input signal permutations leads to common output values for both LUTs, the process determines that the two selected LUTs do not perform the same function. The process then proceeds to step 109, and checks if there are any more pairs of LUTs that have not been tested.

At step 106, the process determines if the two LUTs have at least N common input signals. Two input signals are common if they originate from the same wire or node. The process determines if each input signal to one LUT in the LUT pair is the same as any of the input signals to the other LUT.

Generally, combining the masks of two LUTs that have many common input signals provides a greater area savings on a programmable IC. As an example, the process can require that two 6 input LUTs have at least 4 common input signals in any order. If the two LUTs do not have N common input signals, the process proceeds to step 109, and checks if there are any more pairs of LUTs that have not been tested. The currently selected LUT pair is not combined.

If the two LUTs have at least N common input signals, the process proceeds to step 107. At step 107, the process determines if the two selected LUTs have no more than M unique input signals. LUT pairs that have too many unique input signals should not be combined, because the resulting shared LUT mask is too large. Common input signals between the LUTs are only counted once when determining the number of unique input signals. For example, if two 6 input LUTs have 4 common input signals, the two LUTs have 8 unique input signals. As another example, M is 9, and N=3, for two 6 input LUTs.

If the selected LUT pair has no more than M unique input signals, the process proceeds to step 108. At step 108, the two selected LUTs are marked as shared input LUT partners and removed from the list of LUTs to be tested. The two LUTs marked in step 108 are subsequently combined into one mask during a synthesis process.

If the two selected LUTs have more than M common input signals, the two LUTs are not marked for combination, and the process proceeds to step 109. In summary, two LUTs in the netlist are combined to one ask if (1) they perform the same function, (2) share at least N common input signals, and (3) have no more than M unique input signals.

The process then proceeds to step 109 to determine if there are any more pairs of LUTs in the list that have not been tested to determine if their masks can be combined. If there are no more pairs of LUTs left if the list, the process terminates. If there are more untested pairs of LUTs left in the list, the process proceeds back to step 101, and the process repeats for a newly selected pair of LUTs.

FIG. 2C illustrates a generalized process for converting a circuit design for a programmable integrated circuit into a configuration pattern that can be programmed directly onto a programmable IC.

Initially, a design for a programmable IC is created by a user of the IC. The user typically does not implement the design using LUTs. Typically, users implement a digital circuit design using logic gates.

The user-made design is converted into a netlist during step 210 during a synthesis process. The netlist pattern converts functions in a user-made design into logic elements. Logic elements are blocks on the programmable IC that contain LUTs and registers.

portion of the synthesis process is referred to as technology mapping. During technology mapping, networks of logic gates in the user design are transformed into LUTs. The techniques of the present invention can modify the technology mapping process to increase logic efficiency and save area on the programmable IC.

During placement step 211, the logic elements stored in the netlist are mapped to actual logic elements on a programmable IC. During routing step 212, programmable connections are made between the logic elements using the programmable interconnect resources.

According to a further embodiment of the present invention, LUTs that have been combined into one mask can be broken up when the programmable IC design is adversely effected by the combination. For example, the output signals of two LUTs that are combined may be needed at different portions of the placed programmable design. A large amount of the routing resources on the programmable IC are used to route one output signal of the combined LUT mask to another portion of the placed design. In these situations, the two LUTs that have been combined into an SLM can be broken up into two separate LUTs.

LUTs that have been combined into a shared LUT mask (SLM) effect the timing of a programmable IC design when the SLM is on a critical path. A critical path is a signal path in the programmable IC that constrains the maximum speed of the circuit.

FIG. 2D illustrates a process according to this embodiment of the present invention. In step 251, the process searches for LUTs that have been combined into a shared LUT mask (SLM) and that are on a critical timing path in the programmable IC design. In step 252, the process breaks up these SLM pairings into two separate LUTs again.

In step 253, the process places one of the broken up LUTs into a new logic element on the programmable IC using incremental placement (ICP). The LUT is preferably placed into a logic element closer to where its output signal is needed, in order to reduce timing delays. The other LUT can remain in the same logic element as the SLM pair or can be replaced into a new logic element.

Figure 3:
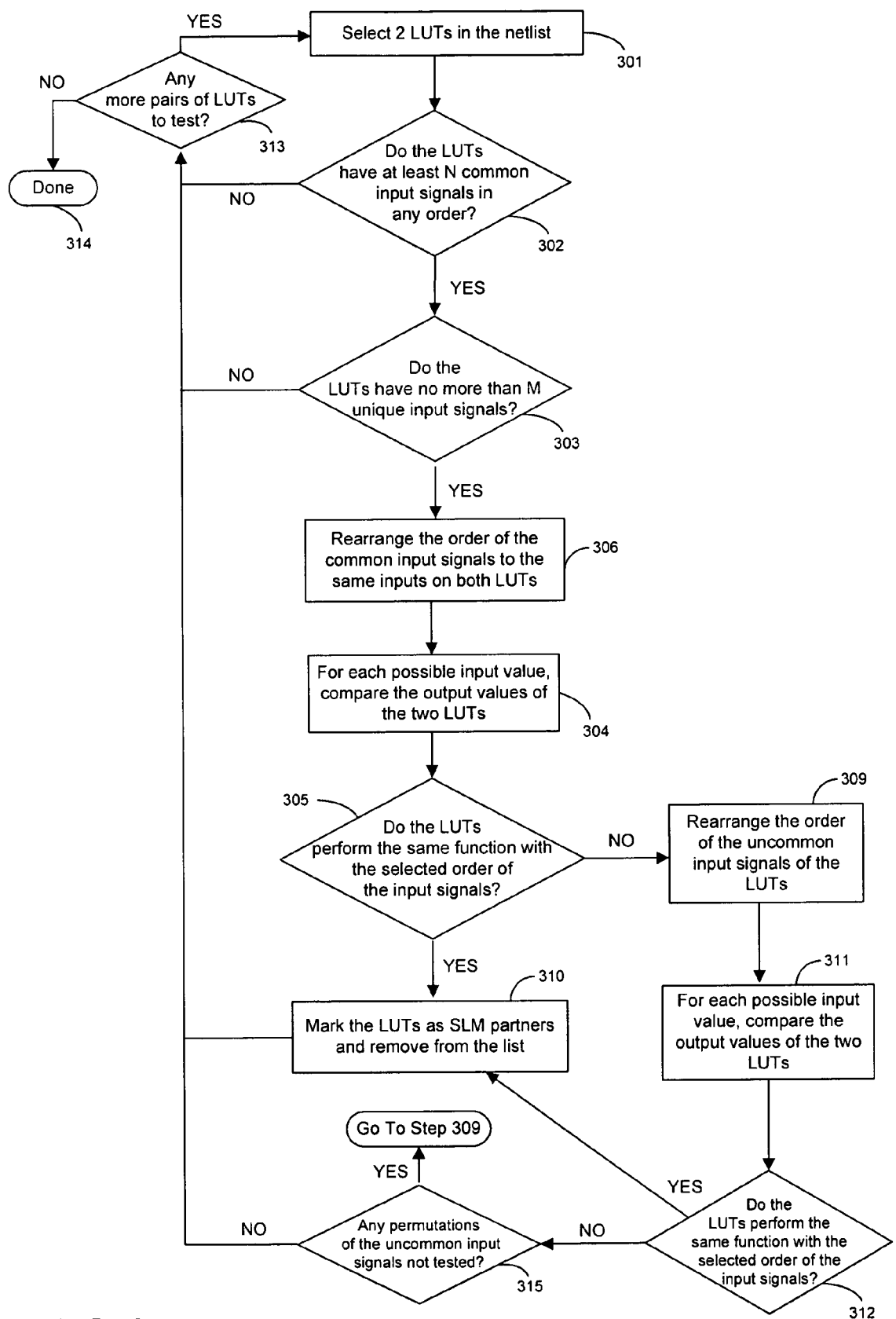
FIG. 3 is a flow chart that illustrates a process for combining lookup tables on a programmable circuit according to a second embodiment of the present invention.

FIG. 3 is a flow chart that illustrates a process for combining lookup tables on a programmable IC according to a second embodiment of the present invention. The process of FIG. 3 is substantially faster and more efficient than the process of FIG. 1, as will be discussed in further detail below.

In step 301, the process selects a pair of two LUTs from the netlist. At step 302, the process determines if the two selected LUTs have at least N common input signals in any order. Common input signals between the LUTs are identified and recorded. Any order of common input signals satisfies the requirement of decisional step 302. For example, if input signals IN1, IN3, IN4, and IN6 are common among input signals IN1-IN6, the requirement of step 302 is satisfied. If the pair of LUTs does not have at least N common input signals, the process proceeds to step 313. At step 313, the process determines if there are any more pairs of LUTs that have not been tested. If there are more LUT pairs to test, the process returns to step 301. If there are not any more LUT pairs to test, the process is done at step 314.

If the selected LUT pair has at least N common input signals, the process proceeds to step 303. In step 303, the process determines whether the LUTs have no more than M unique input signals in any order. Common input signals between the LUTs are treated as one unique input signal, as discussed above.

If the selected LUT pair has more than M unique input signals, the process proceeds to step 313. If the selected LUT pair has M or less unique input signals, the process proceeds to step 306. In step 306, the process rearranges the order of the common input signals on one of the LUTs so that each of the common input signals are provided the same input terminals on both LUTs.

For example, if the LUTs shown in FIGS. 2A-2B are two separate LUTs that are selected in step 301, the order of input signals IN1 and IN3 on the FIG. 2B LUT can be swapped in step 306 so that all four common input signals IN1-IN4 are applied to the same input terminals ABCD of both LUTs in the same order.

If desired, the input signals of both LUTs can be rearranged in step 306. In either case, step 306 causes each common LUT input signal to be applied to the same input terminal in both LUTs in the same order. The process then proceeds to step 304.

In step 304, the process compares the output values of the selected LUTs after applying each possible input value to the input terminals of both LUTs. For each input value provided to the inputs of both LUTs, the output values of the LUTs are compared to determine of they are the same. Step 304 is performed for every possible binary input value that can be applied to the LUTs.

At step 305, the process determines if the LUTs perform the same function (i.e., operation). The LUT pair performs the same function if each LUT generates the same output value for each binary input value. The rearranged order of the input signals from step 306 is used to determine if the LUTs perform the same function.

If the process of FIG. 3 determines that the LUT pairs perform the same function at step 305, the process marks the LUTs as SLM pairs and removes them from the list of LUTs to be tested at step 310. The process can record the order of the input signals with respect to the LUT input terminals that generated the same output values for each binary input value. The two marked LUTs are subsequently combined into one mask during technology mapping.

The process of FIG. 3 is generally faster and more efficient than the process of FIG. 1. By identifying the common input signals between the LUTs first, the FIG. 3 process rearranges the common input signals of the LUTs so that they are applied to the same input terminals on both LUTs in the same order in step 306. Therefore, the process of FIG. 3 does not need to test every permutation of the common input signals to identify an identical function. This process saves a substantial amount of computation time.

The process of FIG. 3 is also more efficient, because it weeds out LUT pairs that have more than M unique input signals and LUT pairs that do not have at least N common input signals. Weeding out steps 302-303 are performed before the LUTs are tested to determine if they implement the same function. Steps 304-305 can be computationally intensive. Therefore, by performing steps 304-305 on less LUTs, a significant amount of computation time is conserved.

If the process of FIG. 3 does not determine that the LUT pair performs the same function in step 305, the process proceeds to step 309. In step 306, the common input signals of both LUTs were rearranged into the same order. However, the other uncommon input signals may still be in the wrong order.

Therefore in step 309, the process rearranges the order of the uncommon input signals with respect to input terminals of at least one of the LUTs. The process then compares the output values of the two LUTs for each possible binary input value at step 311.

If all of the output values of both LUTs are the same, the process determines that the LUTs perform the same function at step 312. The LUT pair is marked as an SLM pair at step 310 and removed from the list of LUT pairs to be tested.

If all of the output values of the LUTs are not the same, the process proceeds to step 315. If there are more permutations of the uncommon input signals to test, steps 309, 311, and 312 are repeated for each permutation of the uncommon input signals, until the process determines that the LUTs perform the same function. If none of the input signal permutations lead to an identical function, the process proceeds to step 313.

For LUT pairs that have only two uncommon input signals, the process implements steps 309, 311, and 312 only once. However, for LUT pairs that have three or more uncommon input signals, these steps can be implemented several times for each permutation of the uncommon input signals.

When the process moves to step 313, it determines if there are any more LUT pairs in the list to test. If there are more LUT pairs left to test, the process returns to step 301 to test the next LUT pair for a possible LUT combination. Otherwise, the process terminates. After the process terminates, the LUT pairs marked in the list at step 310 are combined into one mask on the programmable IC.

The processes of FIGS. 1 and 3 are merely examples of two embodiments of the present invention. It should be understood that details of these two embodiments are not intended to limit the scope of the present invention. The present invention also includes many other systems and methods for combining LUTs into shared LUT masks according to principles and techniques described herein.

The techniques of the present invention can be applied to combine LUTs with any number of input terminals. For example, the techniques of the present invention can be used to combine the masks of two 6 input LUTs. As another example, a 6 input LUT and a 4 or 5 input LUT that share 4 common input signals can be combined. As yet another example, a 6 input LUT and a 4 or 5 input LUT that share 3 common input signals can be combined. As still another example, a 4 and a 5 input LUT can be combined.

By combining LUTs with fewer inputs, the techniques of the present invention can reduce the area consumed by a design for a programmable IC. However, the trade off is that the maximum frequency of the design may be reduced. Also, combining LUTs with fewer inputs can place added constraints on placement step 211.

According to alternative embodiment of the present invention, shared LUT nodes can be matched by using a traditional bipartite matching algorithm. Bipartite matching algorithms are well known to those of skill in the art. Such an algorithm is less computationally efficient.

Numerous types of functions can be implemented as shared LUT masks using the techniques of the present invention. As discussed above, only LUTs that have at least N common input signals and no more than M unique input signals are combined by the SLM processes of FIGS. 1 and 3. The values of N and M used by the process are predetermined in advance. However, in certain circumstances, it may be desirable to combine the masks of two LUTs that less than N common input signals or that have more than M unique input signals.

For example, barrel shifters and cross-bars are functions that can be implemented by lookup tables. A cross-bars can be implemented as a system of k:1 multiplexers that have common data input signals and unique select input signals. A barrel shifter can be implemented as a system of multiplexers that have common data input signals and common select input signals.

Any of these systems of multiplexers can be implemented by one LUT or a system of LUTs. The LUTs that are used to implement functions such as barrel shifters and cross-bars may have more than M unique input signals. Combining LUT masks may provide an area saving without significantly compromising speed and layout constraints, even though the LUTs do not meet the specific requirements of an SLM process.

For certain types of functions, it can be desirable to combine the LUT masks that perform particular functions even though the LUTs do not meet some of the requirements of an SLM process. Barrel shifters and cross-bars are examples of functions that typically contain more than M (e.g., 6) unique input signals.

According to an embodiment of the present invention, a process checks whether a function performed by a LUT is in a special class (such as a barrel shifter). If the LUT performs one of the special functions, the LUT is replaced with a pre-designed LUT that performs a similar function and that has M or less unique input signals. All of the LUTs in a circuit design for a programmable IC that perform the same special function are replaced with the pre-designed LUT that performs the similar function.

Two or more of these pre-design replacement LUTs can then be combined into one or more shared LUT masks if they have at least N common input signals. Repair circuitry is coupled to the outputs of the shared LUT mask network to correct the SLM output signals so that they implement the originally intended function (e.g., the barrel shifter function).

Figure 4:
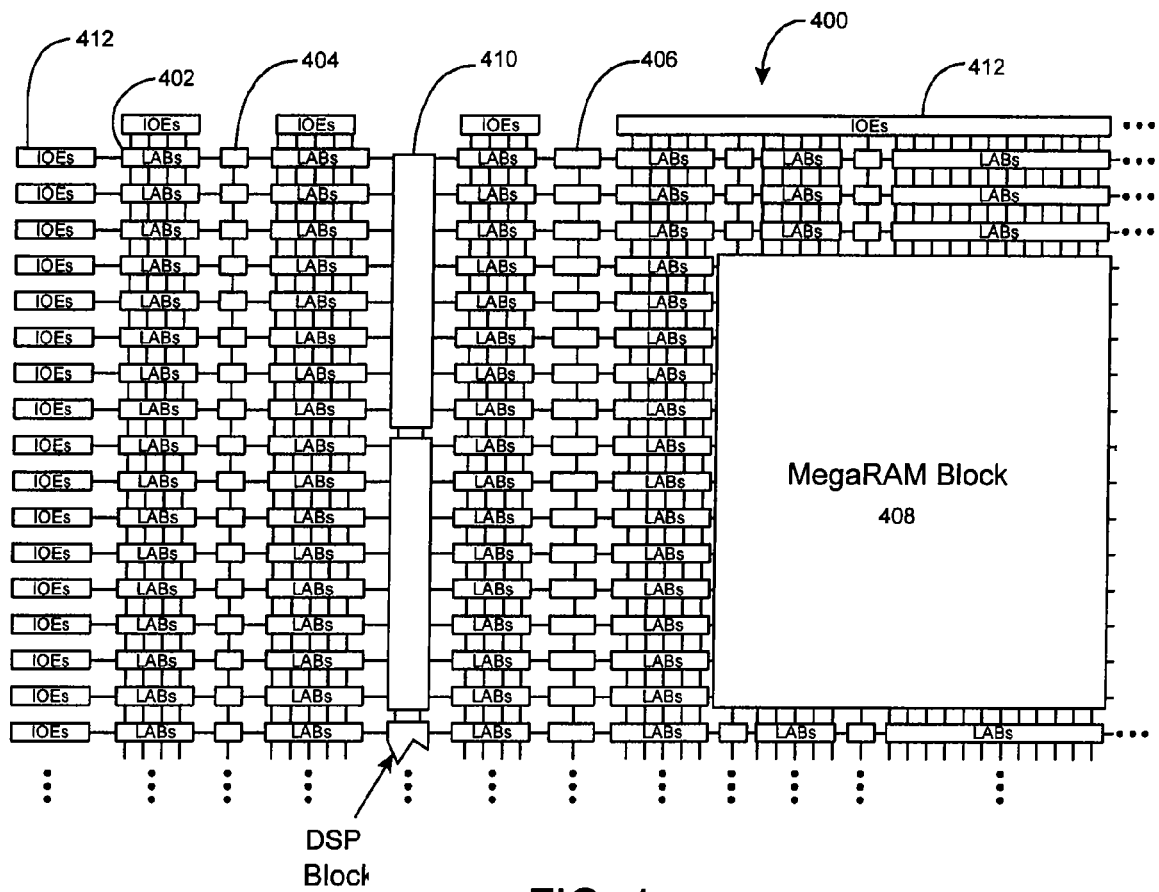
FIG. 4 is a simplified block diagram of a programmable logic device that can implement embodiments of the present invention.

FIG. 4 is a simplified partial block diagram of an exemplary high-density PLD 400 wherein techniques according to the present invention can be utilized. PLD 400 includes a two-dimensional array of programmable logic array blocks (or LABs) 402 that are interconnected by a network of column and row interconnects of varying length and speed. LABs 402 include multiple (e.g., 10) logic elements (or LEs), an LE being a small unit of logic that provides for efficient implementation of user defined logic functions.

PLD 400 also includes a distributed memory structure including RAM blocks of varying sizes provided throughout the array. The RAM blocks include, for example, 512 bit blocks 404, 4 K blocks 406 and a MegaBlock 408 providing 512 K bits of RAM. These memory blocks may also include shift registers and FIFO buffers. PLD 400 further includes digital signal processing (DSP) blocks 410 that can implement, for example, multipliers with add or subtract features. I/O elements (IOEs) 412 located, in this example, around the periphery of the device support numerous single-ended and differential I/O standards. It is to be understood that PLD 400 is described herein for illustrative purposes only and that the present invention can be implemented in many different types of PLDs, FPGAs, and the like.

Figure 5:
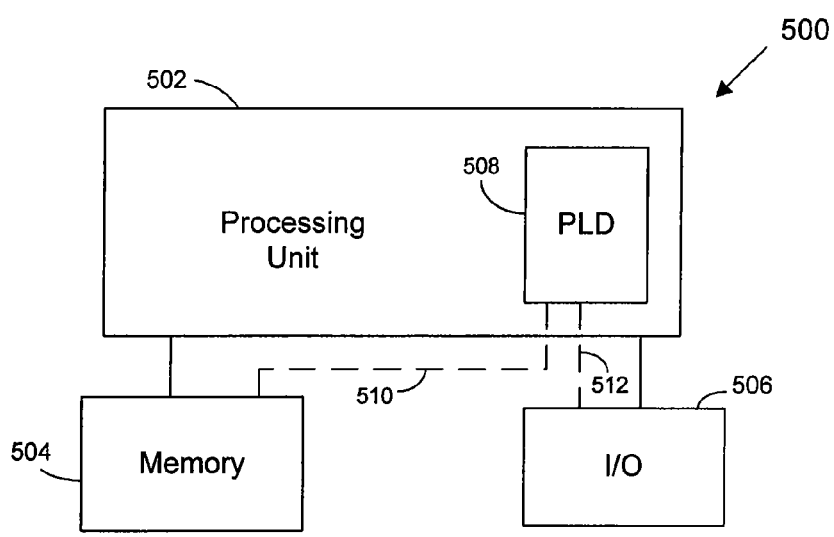
FIG. 5 is a block diagram of an electronic system that can implement embodiments of the present invention.

While PLDs of the type shown in FIG. 4 provide many of the resources required to implement system level solutions, the present invention can also benefit systems wherein a PLD is one of several components. FIG. 5 shows a block diagram of an exemplary digital system 500, within which the present invention may be embodied. System 500 can be a programmed digital computer system, digital signal processing system, specialized digital switching network, or other processing system. Moreover, such systems may be designed for a wide variety of applications such as telecommunications systems, automotive systems, control systems, consumer electronics, personal computers, Internet communications and networking, and others. Further, system 500 may be provided on a single board, on multiple boards, or within multiple enclosures.

System 500 includes a processing unit 502, a memory unit 504 and an I/O unit 506 interconnected together by one or more buses. According to this exemplary embodiment, a programmable logic device (PLD) 508 is embedded in processing unit 502. PLD 508 may serve many different purposes within the system in FIG. 5. PLD 508 can, for example, be a logical building block of processing unit 502, supporting its internal and external operations. PLD 508 is programmed to implement the logical functions necessary to carry on its particular role in system operation. PLD 508 may be specially coupled to memory 504 through connection 510 and to I/O unit 506 through connection 512.

Processing unit 502 may direct data to an appropriate system component for processing or storage, execute a program stored in memory 504 or receive and transmit data via I/O unit 506, or other similar function. Processing unit 502 can be a central processing unit (CPU), microprocessor, floating point coprocessor, graphics coprocessor, hardware controller, microcontroller, programmable logic device programmed for use as a controller, network controller, and the like. Furthermore, in many embodiments, there is often no need for a CPU.

For example, instead of a CPU, one or more PLDs 508 can control the logical operations of the system. In an embodiment, PLD 508 acts as a reconfigurable processor, which can be reprogrammed as needed to handle a particular computing task. Alternately, programmable logic device 508 may itself include an embedded microprocessor. Memory unit 504 may be a random access memory (RAM), read only memory (ROM), fixed or flexible disk media, PC Card flash disk memory, tape, or any other storage means, or any combination of these storage means.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. A method for combining lookup tables (LUTs) in a design for a programmable integrated circuit, the method comprising:
   selecting first and second LUTs from the design;
   determining whether both of the LUTs implement a same function;
   if the first and the second LUTs implement the same function, combining masks of the LUTs into a shared LUT mask in the design;
   before determining whether the LUTs implement the same function, identifying common input signals between the first and the second LUTs; and
   arranging an order of input signals of one of the LUTs so that each of the common input signals is applied to a corresponding input terminal in both of the LUTs to provide a first arranged order of the input signals,
   wherein the method determines whether the LUTs implement the same function based on the first arranged order of the input signals.

2. The method of claim 1 further comprising:
   if the LUTs do not implement the same function based on the first arranged order, rearranging an order of at least two uncommon input signals of one of the LUTs with respect to input terminals of that LUT to provide a second rearranged order; and
   determining if both LUTs implement the same function based on the second rearranged order of the input signals.

3. The method of claim 1 further comprising:
   before determining whether the LUTs implement the same function, determining if the LUTs have at least N common input signals; and
   if the LUTs do not have at least N common input signals, preventing the masks of the LUTs from being combined.

4. The method of claim 3 further comprising:
   before determining if the LUTs implement the same finction, determining if the LUTs have more than M unique input signals; and
   if the LUTs have more than M unique input signals, preventing the masks of the LUTs from being combined.

5. The method of claim 1 wherein determining if the LUTs both perform the same function further comprises:
   determining if an output value of the first LUT equals an output value of the second LUT for each possible input value that is applied to the input terminals of both of the LUTs.

6. The method of claim 1 further comprising:
   selecting third and fourth LUTs from the design;

determining if both of the third and the fourth LUTs implement a same function;

if the third and the fourth LUTs implement the same function, combining masks of the third and the fourth LUTs into a shared mask in the design.

7. The method of claim 6 further comprising:

if the third and the fourth LUTs do not implement the same function, rearranging an order of at least two input signals of the third LUT with respect to input terminals of the third LUT to provide a first rearranged order; and determining if both the third and the fourth LUTs implement the same function based on the first rearranged order of the third LUT input signals.

8. The method of claim 1 further comprising:

breaking apart the mask of the LUTs if the mask lies in a critical path in the design and placing the first and the second LUTs into different logic elements within the design.

9. The method of claim 1 further comprising:

after determining whether both of the LUTs implement the same function, determining if LUTs have at least N common input signals; and determining whether the LUTs have no more than M unique input signals, wherein the LUT masks are combined into the shared LUT mask only if the LUTs have at least N common input signals and no more than M unique input signals.

10. A method for combining lookup tables (LUTs) in a design for a programmable integrated circuit, the method comprising:

selecting first and second LUTs from the design;

determining whether both of the LUTs implement a same function;

if the first and the second LUTs implement the same function, combining masks of the LUTs into a shared LUT mask in the design;

if the LUTs do not implement the same function, rearranging an order of at least two input signals of the first LUT with respect to input terminals of the first LUT to provide a first rearranged order;

determining if both LUTs implement the same function based on the first rearranged order of the first LUT input signals;

if the LUTs implement the same function with the first rearranged order, combining the masks of the LUTs into a shared LUT mask in the design; and if the LUTs do not implement the same function with the first rearranged order, rearranging the order of at least two input signals of the first LUT with respect to the input terminals of the first LUT to provide a second rearranged order.

11. The method of claim 5 further comprising:

determining if both LUTs implement the same function based on the second rearranged order of the first LUT input signals;

if the LUTs implement the same function with the second rearranged order, combining masks of the LUTs into a shared LUT mask in the design; and if the LUTs do not implement the same function with the second rearranged order, rearranging the order of at least two input signals of the first LUT with respect to the input terminals of the first LUT to provide a third rearranged order.

12. A computer program product comprising a computer readable medium encoded with program code for controlling operation of a computer system to combine lookup tables (LUTs) in a design for a programmable integrated circuit, the program code including:

code for selecting first and second LUTs in the design;

code for comnparing output values of the LUTs to determine if the LUTs generate an identical function;

code for combining masks of the LUTs in the design if the LUTs generate the identical function;

code for determining if the LUTs have at least N common input signals; and code for determining if the LUTs have no more than M unique input signals, wherein implementation of the code for comparing the output values of the first and second LUTs is prevented if the first and second LUTs have less than N common input signals or more than M unique input signals.

13. The computer program product of claim 12 wherein the program code further includes:

code for determining if the first and the second LUTs have at least N common input signals, before determining whether the first and the second LUTs implement the identical function; and code for ordering input signals of at least one of the LUTs so that each of the common input signals is applied to a corresponding LUT input terminal in the same order to provide a first rearranged order of the input signals, if the LUTs have at least N common input signals, wherein the code for comparing the output values of the LUTs determines whether the LUTs implement the identical fimction based on the first rearranged order of the input signals.

14. The computer program product of claim 13 wherein the program code further includes:

code for rearranging an order of at least two uncommon input signals with respect to input terminals of one the LUTs to provide a second rearranged order, if the LUTs do not implement the same function; and code for comparing output values of the LUTs to determine if the LUTs generate the identical function based on the second rearranged order of the input signals.

15. The computer program product of claim 12 wherein the program code further includes:

code for rearranging a first order of input signals of one of the LUTs with respect to input terminals of that LUT to provide a first rearranged order of the input signals, if the LUTs do not generate the identical function based on the first order; and code for determining if the LUTs implement the identical function based on the first rearranged order of the input signals.

16. The computer program product of claim 15 wherein the program code further includes:

code for combining the masks of the LUTs in the design if the LUTs implement the identical function with the first rearranged order; and code for rearranging the order of the input signals of one of the LUTs with respect to the input terminals of that LUT to provide a second rearranged order of the input signals, if the LUTs do not implement the identical function with the first rearranged order.

17. The computer program product of claim 16 wherein the program code further includes:

code for combining the masks of the LUTs in the design if the LUTs implement the identical function with the second rearranged order; and code for rearranging the order of the input signals of one of the LUTs with respect to the input terminals of that LUT to provide a third rearranged order, if the LUTs do not implement the identical function with the second rearranged order.

18. The computer program product of claim 16 wherein the program code further includes:

code for determining if the LUTs have at least N common input signals, after the output values of the LUTs have been compared;

code for determining if the LUTs have no more than M unique input signals, after the output values of the LUTs have been compared, wherein the masks of the first and the second LUTs are not combined if the LUTs have less than N common input signals or more than M unique input signals.

19. The computer program product of claim 12 wherein the program code further includes:

code for breaking apart the mask of the LUTs if the mask lies in a critical path in the design and placing the first and the second LUTs into different logic elements within the design.

\* \* \* \* \*

UNITED STATES PATENT AND TRADEMARK OFFICE
CERTIFICATE OF CORRECTION

| | |
|---|---|
| PATENT NO. | : 7,350,176 B1 |
| APPLICATION NO. | : 10/622923 |
| DATED | : March 25, 2008 |
| INVENTOR(S) | : Baeckler et al. |

It is certified that error appears in the above-identified patent and that said Letters Patent is hereby corrected as shown below:

Claim 4, column 10, line 55, delete "finction", insert --function--

Claim 12, column 12, line 5, delete "comnparing", insert --comparing--

Signed and Sealed this

Fifth Day of August, 2008

JON W. DUDAS
*Director of the United States Patent and Trademark Office*